(12) United States Patent
Tsunoda et al.

(10) Patent No.: US 7,089,817 B2
(45) Date of Patent: Aug. 15, 2006

(54) METHOD OF ANALYZING PHYSICAL PROPERTY OF GOLF BALL

(75) Inventors: Masaya Tsunoda, Kobe (JP); Masaki Shiraishi, Kobe (JP)

(73) Assignee: SRI Sports Limited, Kobe (JP)

( * ) Notice: Subject to any disclaimer, the term of this patent is extended or adjusted under 35 U.S.C. 154(b) by 202 days.

(21) Appl. No.: 10/443,030

(22) Filed: May 22, 2003

(65) Prior Publication Data
US 2003/0226410 A1    Dec. 11, 2003

(30) Foreign Application Priority Data
Jun. 10, 2002    (JP)    ............................ 2002-168123

(51) Int. Cl.
*G01N 19/00* (2006.01)
(52) U.S. Cl. .................................... 73/866.4
(58) Field of Classification Search ............... 73/866.4, 73/865.6; 702/41–43, 155; 703/217; 345/420
See application file for complete search history.

(56) References Cited

U.S. PATENT DOCUMENTS

| 6,165,081 A * | 12/2000 | Chou | .......................... 473/329 |
| 6,556,944 B1 * | 4/2003 | Miyamoto | .................. 702/155 |
| 2002/0023508 A1 | 2/2002 | Miyamoto | |

\* cited by examiner

*Primary Examiner*—Robert Raevis
(74) *Attorney, Agent, or Firm*—Birch, Stewart, Kolasch & Birch, LLP (57) ABSTRACT

A model (1) is obtained by dividing a golf ball into meshes. The model (1) comprises a large number of elements (3). An outermost layer of the model is wholly formed by fine elements (3*a*). The outermost layer is wholly formed by a fine element region. A number (Na) of divisions in the fine element region is larger than a number (Nb) of divisions on an inner layer in the fine element region. A ratio (Na/Nb) is 1.1 to 15.0. The fine element (3*a*) and an element (3*b*) on the inside of the fine element (3*a*) are tied to each other. A physical property value of the golf ball is analyzed by a finite element method using the model (1).

14 Claims, 7 Drawing Sheets

METHOD OF ANALYZING PHYSICAL PROPERTY OF GOLF BALL

BACKGROUND OF THE INVENTION

1. Field of the Invention

The present invention relates to a method of analyzing a physical property of a golf ball. More particularly, the present invention relates to a method of forming a model of a golf ball of which physical property is to be analyzed by a simulation such as a finite element method, a finite volume method or the like.

2. Description of the Related Art

A golf ball is hit with a golf club and thus flies. A resilience characteristic during hitting greatly influences a flight distance of the golf ball. A golf player is very interested in the flight distance. Therefore, a golf ball manufacturer has aimed at obtaining an improvement in a resilience performance and has made an effort toward development all the time.

In the development of the golf ball, first of all, a design is carried out and a trial product is then fabricated. The trial product is subjected to a hitting test and a flight distance is measured together with a resilience coefficient. Data thus obtained by the measurement are decided. If the obtained result is insufficient, the data are fed back to a next design. In the development of the golf ball, thus, the design, the trial production and the evaluation are repeated, which takes a great deal of labor and time.

In place of the hitting test or together with the hitting test, the physical property is measured in a room in some cases. Examples of the physical property which can be measured in the room include a resilience coefficient, a compression deformation (so-called compression), a specific frequency, an impact force and the like. The physical property can be measured more easily in the room than the hitting test. However, the measurement of the physical property in the room is the same as the hitting test in that the trial product is to be fabricated. Thus, it takes a great deal of labor and time to develop the golf ball.

Only the data on the physical property of the whole golf ball can be obtained by any of the hitting test and the measurement of the physical property in the room. It is hard to grasp a behavior presented by each portion of the golf ball during collision or compression and deformation. For this reason, trial and error are often repeated from a design to an evaluation in the development of the golf ball.

There has also been proposed a method of carrying out a simulation utilizing a finite element method, a finite volume method or the like, thereby evaluating a golf ball without performing trial production. In the simulation, an analyzing object (a golf ball) is divided into a large number of meshed elements so that a model can be obtained.

In consideration of precision in the analysis to be carried out by the simulation, it is preferable that the number of divisions in the model should be larger. However, an increase in the number of divisions causes an increase in a load applied to a computer. Consequently, a time required for the analysis is considerably prolonged. An enhancement in the precision in the analysis is contrary to a reduction in the time required for the analysis.

SUMMARY OF THE INVENTION

The present invention provides a method of analyzing a physical property of a golf ball comprising the steps of:

(a) dividing a golf ball into a large number of meshed elements to obtain a model including a plurality of layers formed by a group of the elements; and (b) analyzing a physical property by a simulation using the model.

The model includes a layer having at least a part set to be a fine element region. A number Na of divisions in a circumferential direction of the fine element region is larger than a number Nb of divisions in a circumferential direction of an inner part of the layer.

In the case in which the golf ball comes in contact with another object and is thus deformed, the amount of the deformation is larger in the vicinity of a surface than that in the vicinity of a center. A deforming behavior in the vicinity of the surface greatly influences a physical property value which is obtained. In the model to be used in the analyzing method according to the present invention, the fine element region positioned relatively close to the outside can have precision in an analysis enhanced. On the other hand, the number Nb of divisions of the inner part of the layer including the fine element region is small. For this reason, a load applied to a computer during the analysis is not very great. In this analyzing method, high precision in the analysis can be obtained and a time required for the analysis is not long.

In consideration of the consistency of the high precision in the analysis and a short time required for the analysis, it is preferable that a ratio (Na/Nb) should be 1.1 to 15.0.

It is preferable that the fine element region should be positioned on an outermost layer of the model. The fine element region is positioned on the outermost layer which influences the physical property value most greatly. Consequently, the precision in the analysis can be more enhanced.

It is preferable that the element in the fine element region and the element on an inner layer of the fine element region should be tied to each other. Although both numbers of the divisions are different from each other, it is possible to obtain a suitable model for the simulation by the tying.

It is preferable that a layer including the fine element region should also include a region having a smaller number of divisions than that in the fine element region. The fine element region is positioned in the region coming in contact with another object. Consequently, the precision in the analysis can be maintained and the time required for the analysis can further be shortened at the same time.

DESCRIPTION OF THE PREFERRED EMBODIMENTS

The present invention will be described below in detail based on a preferred embodiment with reference to the drawings.

Figure 1:
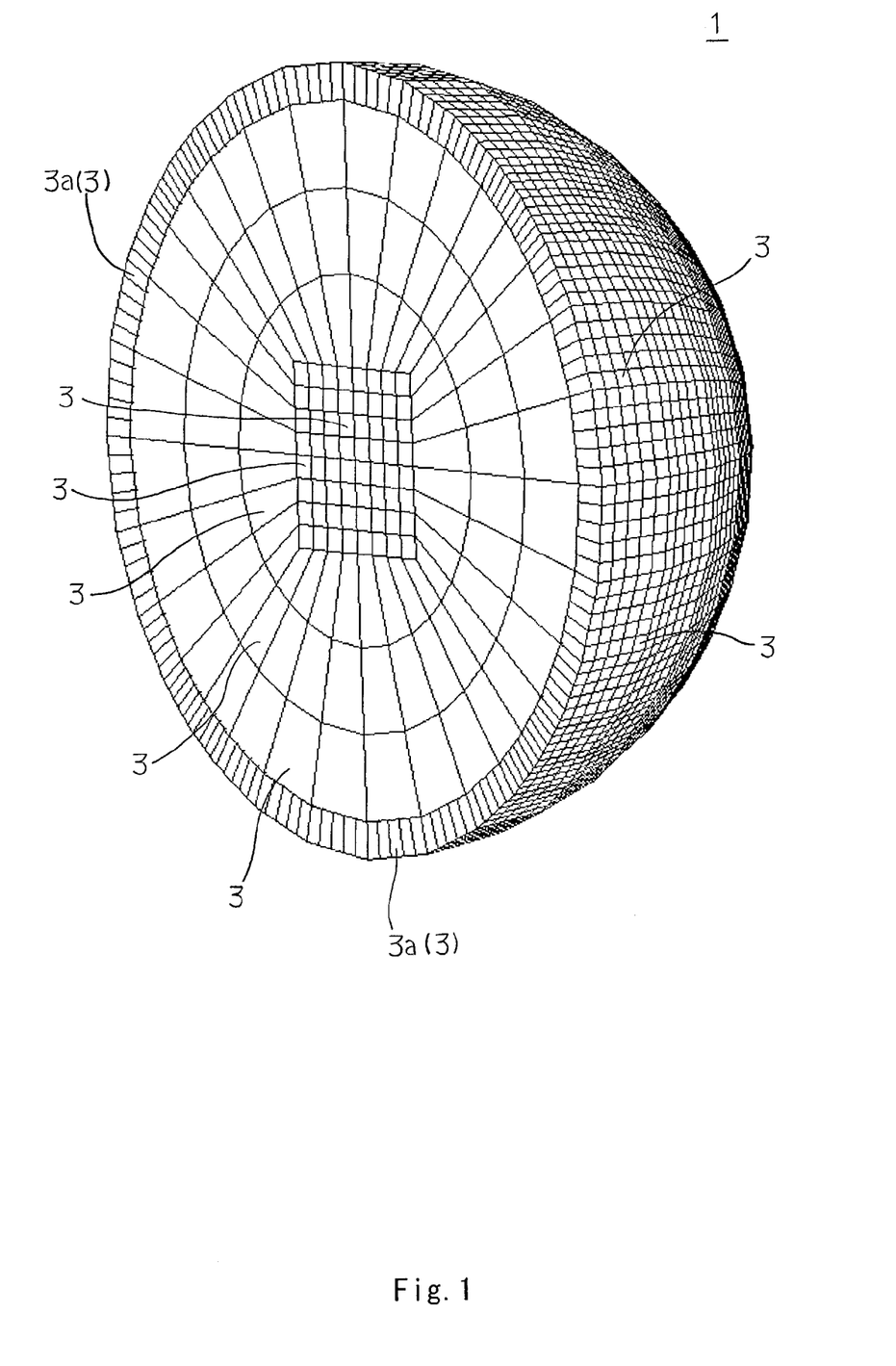
FIG. 1 is a perspective sectional view showing a model to be used in a method of analyzing a physical property of a golf ball according to an embodiment of the present invention.

The whole shape of a model 1 shown in FIG. 1 is almost spherical. FIG. 1 shows a half portion (having an almost semi-spherical shape) cut on a plane passing through a center of the model 1. The model 1 is obtained by dividing a golf ball into meshes. The model 1 has a diameter of 40 mm to 45 mm, particularly 42.67 mm to 42.85 mm. The model 1 comprises a large number of elements 3. All of the elements 3 are hexahedrons. The element 3 is distributed like a layer from the center of the model 1 to a surface thereof. In this example, the model 1 has eight layers. Each of layers is formed by a group of elements.

Figure 2:
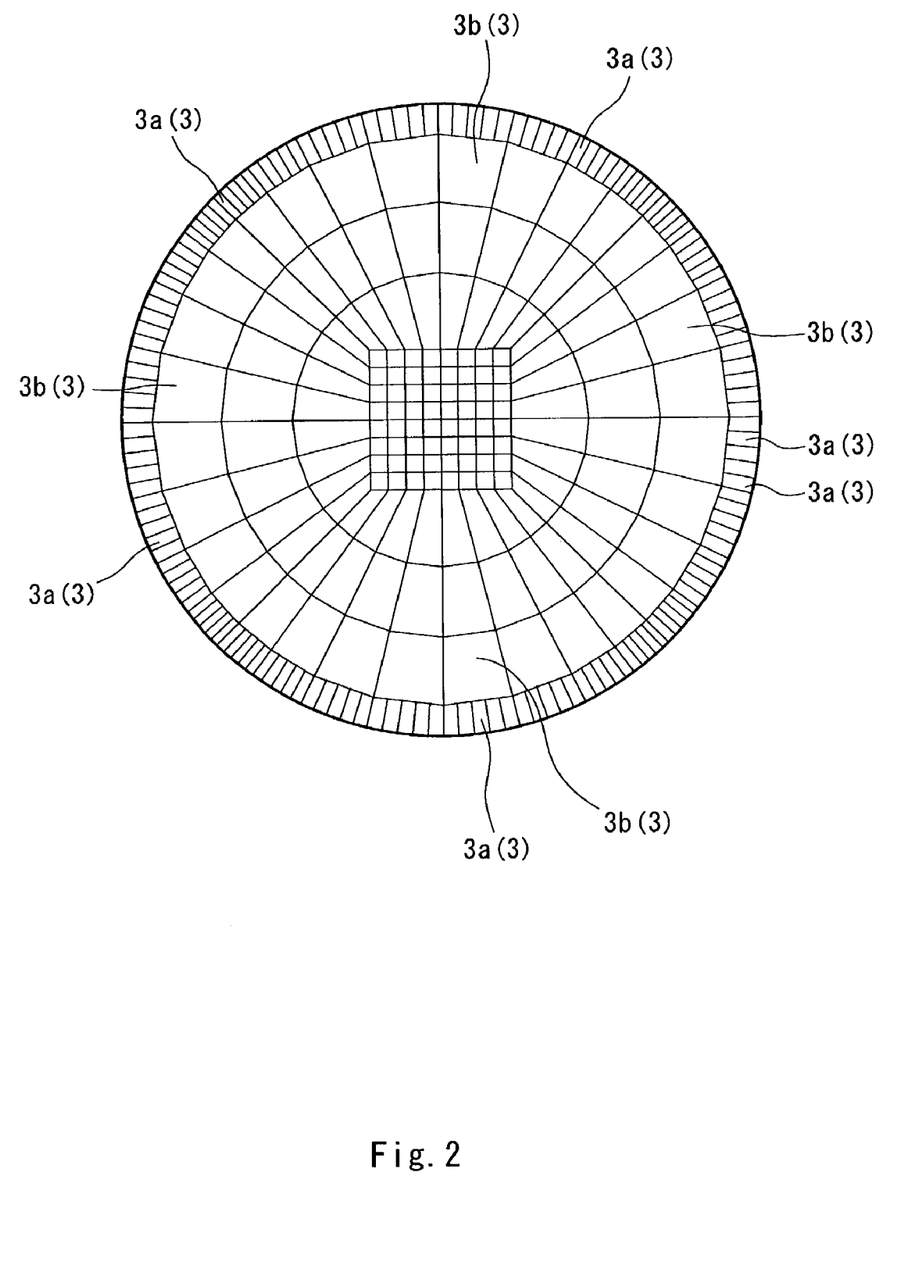
FIG. 2 is a sectional view showing the model in FIG. 1.

FIG. 2 is a sectional view showing the model 1 of FIG. 1. In FIG. 2, the reference numeral 3a denotes a fine element. On the other hand, the reference numeral 3b denotes an element provided on the inside of the fine element 3a in contact with the fine element 3a. The outermost layer of the model is wholly formed by the fine elements 3a. In this specification, a region having a large number of fine elements 3a collected will be referred to as a fine element region. The outermost layer is wholly formed by the fine element region.

In the sectional view of FIG. 2, one element 3b is provided in contact with five fine elements 3a. In other words, a number Na of divisions in a circumferential direction of the fine element region is five times as large as a number Nb of divisions in the circumferential direction of the inner layer of the fine element region. The number Na of the outermost layer (that is, the fine element region) is large and the individual fine element 3a is small. For this reason, the surface of the model 1 approximates to a spherical surface. In the case in which a physical property value is predicted by a finite element method using the model 1 when the golf ball comes in contact with another object, an error can be controlled because of the small size of the fine element 3a. In this analyzing method, the physical property value can be predicted with high precision.

Since the number of the divisions of the inner layer in the fine element region is small, a load applied to a computer is small in a simulation. In this analyzing method, the physical property of a golf ball can be analyzed in a short time.

It is preferable that a ratio (Na/Nb) should be 1.1 to 15.0. Consequently, precision in an analysis and a short time are consistent with each other. In respect of the precision in an analysis, the ratio (Na/Nb) is more preferably 2.0 to 12.0 and particularly preferably 3.0 to 10.0.

It is preferable that the number of divisions per whole circumference (360 degrees) of the fine element region should be 32 to 960. In some cases in which the number of the divisions is less than the range described above, the precision in an analysis is insufficient. From this viewpoint, the number of the divisions is more preferably 48 or more and particularly preferably 64 or more. In some cases in which the number of the divisions is more than the range described above, a time required for the analysis is prolonged. From this viewpoint, the number of the divisions is more preferably 480 or less and particularly preferably 320 or less. As a matter of course, the performance of the computer is enhanced so that the number of the divisions can be set to be larger. A length in the radial direction of the fine element 3a is usually 0.1 mm to 10.0 mm and particularly preferably 0.5 mm to 5.0 mm.

It is preferable that the number of divisions per whole circumference (360 degrees) of the inner layer of the fine element region should be 16 to 48. In some cases in which the number of the divisions is less than the range described above, the precision in an analysis is insufficient. From this viewpoint, the number of the divisions is particularly preferably 24 or more. In some cases in which the number of the divisions is more than the range described above, the time required for the analysis is prolonged. From this viewpoint, the number of the divisions is particularly preferably 40 or less. As a matter of course, the performance of the computer is enhanced so that the number of the divisions can be set to be larger.

It is preferable that the number of the included elements 3 should be 864 to 100000. If the number of the elements 3 is less than the range described above, there is a possibility that the precision in an analysis might be insufficient. From this viewpoint, the number of the elements 3 is more preferably 1664 or more and particularly preferably 2816 or more. If the number of the elements 3 is more than the range described above, there is a possibility that the time required for the analysis might be prolonged. From this viewpoint, the number of the elements 3 is more preferably 50000 or less and particularly preferably 20000 or less. As a matter of course, the performance of the computer is enhanced so that the number of the elements can be set to be larger.

It is preferable that the elements 3 (the fine element 3a and the element 3b) which are adjacent to each other in a radial direction and have the numbers of divisions different from each other should be subjected to a tied processing. By the tied processing, it is possible to obtain a model taking an integral behavior on an interface of both the fine element 3a and the element 3b provided on the inside thereof.

The ideal shape of the element 3 in a simulation such as a finite element method is a cube. If the fine element 3a approximates to the cube, that is, the aspect ratio of the fine element 3a approximates to 1/1, precision in the analysis of a physical property is more enhanced. In respect of the precision in the analysis, a mean aspect ratio in the fine element region is preferably 1/1 to 4/1 and more preferably 1/1 to 3/1. The aspect ratio implies a ratio (La/Lb) of the greatest length La to the smallest length Lb in the side of the element.

As described above, in this model, all of the elements 3 are hexahedrons. The hexahedron includes eight vertexes. In general, elements are supposed to be tetrahedrons, pentahedrons, hexahedrons or the like in a simulation. The hexahedral element is the most excellent in precision in representation of a deforming behavior because eight integral points can be used. The model 1 shown in FIGS. 1 and 2 is excellent in the precision in the analysis because all of the elements 3 are the hexahedrons. As a matter of course, all of the elements 3 do not need to be the hexahedrons but an element having another shape such as the tetrahedron and the hexahedral element may be present together. In respect of the precision in the analysis, the ratio of the number of the hexahedral elements to the number of all the elements is preferably 70% or more and particularly preferably 80% or more, and ideally 100%.

The number of the layers in the model 1 is not particularly restricted but is usually 3 to 25 and particularly 5 to 18.

In the case in which a golf ball comprising a core, a cover and a paint layer collides against another object, the paint layer directly comes in contact with the object. Since the paint layer usually has a very small thickness, the deforming behavior rarely influences the physical property of the golf ball. The deforming behavior of the cover positioned on the outermost side excluding the paint layer influences the physical property of the golf ball most greatly. In respect of the precision in the analysis, it is preferable that a portion corresponding to the cover in the model should be included in the fine element region. The cover usually contains a thermoplastic resin, typically an ionomer resin as a principal component.

The golf ball has dimples on a surface thereof. The diameter of the dimple is usually smaller than 10% of the diameter of the golf ball. In the element 3 having a large size, it is hard to accurately predict the deforming behaviors of the dimple and the vicinity thereof. If an outermost layer is set to be the fine element region, it is possible to obtain a model which is reflected by the shape of the dimple.

The fine element region does not need to be always positioned on the outermost layer. In respect of the precision in the analysis, it is preferable that the fine element region should be positioned close to the outside if possible. If the radius of the model is represented by R, the fine element region is preferably positioned on the outside of a position of 0.4·R from the surface of the model and is more preferably positioned on the outside of a position of 0.2·R from the surface of the model.

An almost hemispherical or almost quarter spherical model may be supposed. Also in the almost hemispherical or almost quarter spherical model, at least a part of an outward layer is set to be the fine element region. The golf ball takes a spherical shape and has an excellent symmetry. By utilizing a translation constraint and a rotation constraint, therefore, it is possible to analyze the hemispherical model and the quarter spherical model without deteriorating precision in a measurement. In addition, it is possible to shorten a time required for the formation of the model and an analysis processing by using the hemispherical model and the quarter spherical model.

Figure 3:
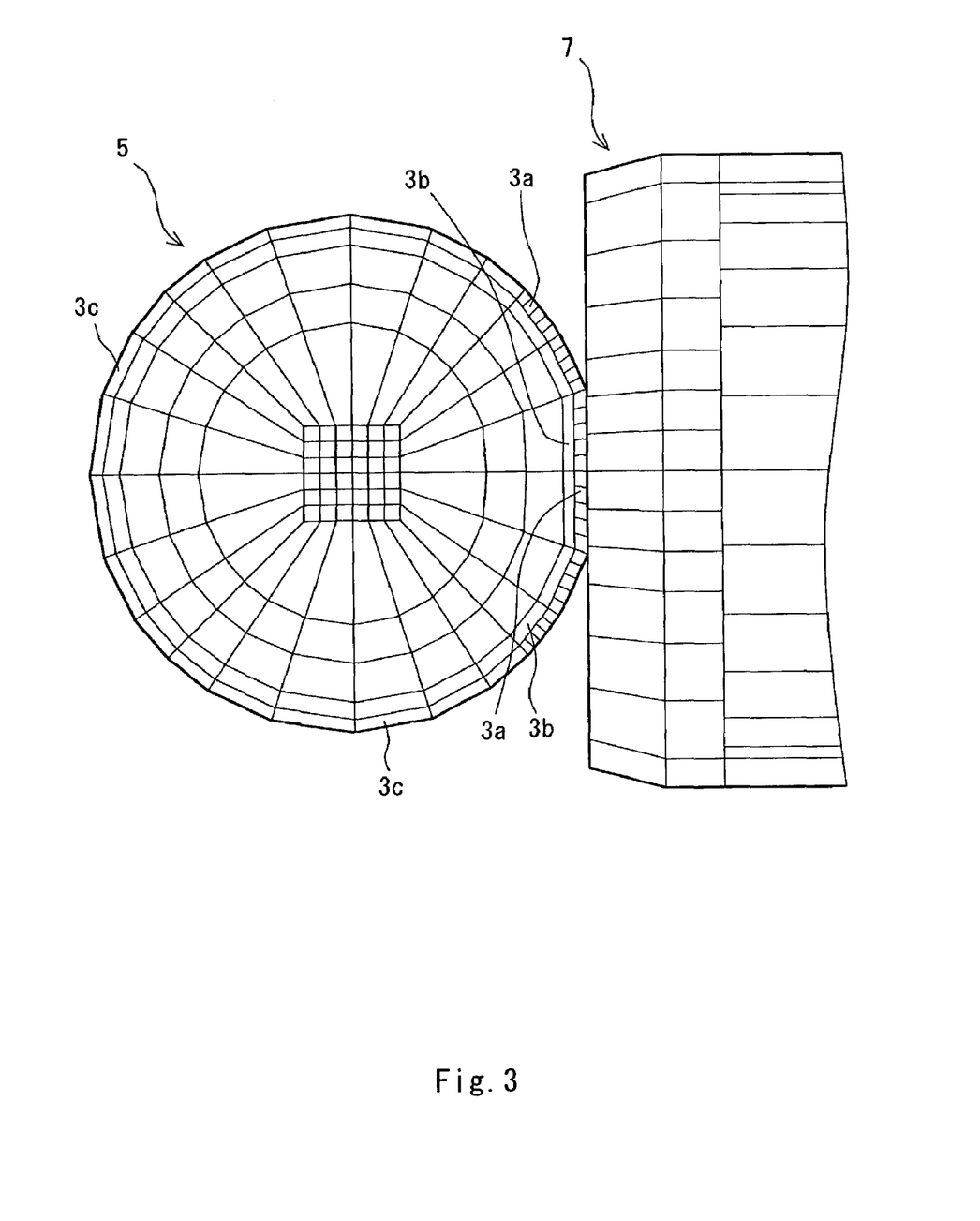
FIG. 3 is a sectional view showing a model to be used in a method of analyzing a physical property of a golf ball according to another embodiment of the present invention together with a metallic and cylindrical model.

It is not necessary to set all of the outermost layers to be the fine element regions. FIG. 3 is a sectional view showing, together with a metallic and cylindrical model 7, a model 5 to be used in a method of analyzing a physical property of a golf ball according to another embodiment of the present invention. The analyzing method is carried out to predict a resilience coefficient when the golf ball comes in contact with (collides against) a metallic cylinder. The outermost layer of the model 5 is constituted by a fine element 3a and another element 3c. The fine element region of the outermost layer is positioned in a portion coming in contact with the metallic cylinder and in the vicinity thereof. A number Na of divisions in the fine element region of the outermost layer is greater than a number Nc of divisions in another region.

A region other than the fine element region in the outermost layer does not come in contact with the metallic and cylindrical model 7. Even if the number Nc is decreased, therefore, a resilience coefficient can be predicted with high precision. The number Nc is decreased so that a load to be applied to a computer is further reduced and a time required for an analysis can be shortened.

It is preferable that a ratio (Na/Nc) should be 1.1 to 15.0. Consequently, the precision in the analysis is consistent with a short time. In this respect, the ratio (Na/Nc) is more preferably 2.0 to 12.0 and particularly preferably 3.0 to 10.0.

Also in the model 5, it is preferable that the ratio (Na/Nb) of the number Na of divisions in the fine element region to the number Nb of divisions of the inner layer of the fine element region should be 1.1 to 15.0. Consequently, the precision in the analysis is consistent with a short time. In this respect, the ratio (Na/Nb) is more preferably 2.0 to 12.0 and particularly preferably 3.0 to 10.0.

Figure 4:
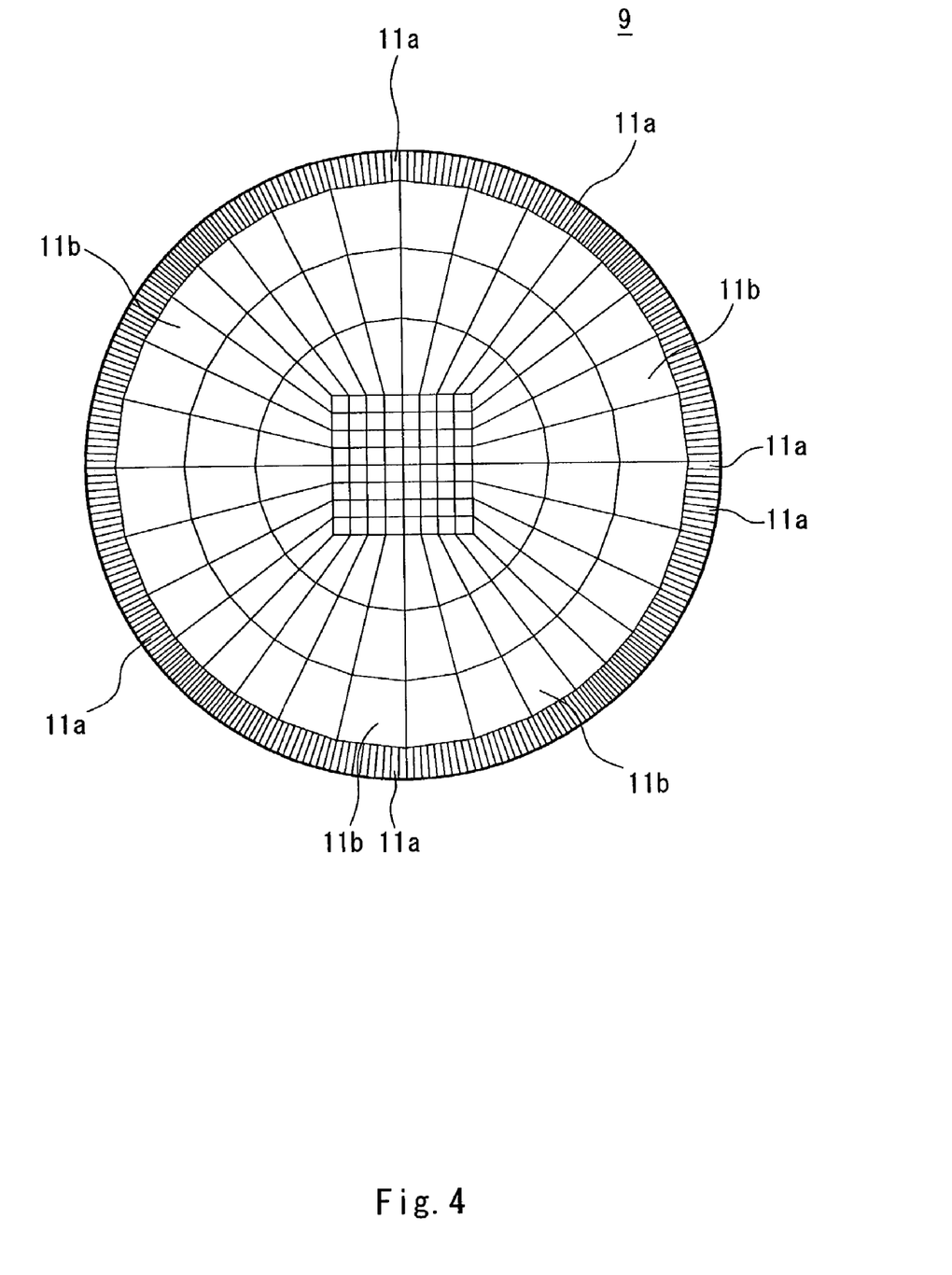
FIG. 4 is a sectional view showing a model to be used in a method of analyzing a physical property of a golf ball according to yet another embodiment of the present invention.

FIG. 4 is a sectional view showing a model 9 to be used in a method of analyzing a physical property of a golf ball according to a further embodiment of the present invention. The whole shape of the model 9 is almost spherical. The model 9 is obtained by dividing the golf ball into meshes. In FIG. 4, the reference numeral 11a denotes a fine element. On the other hand, the reference numeral 11b denotes an element which is provided on the inside of the fine element 11a in contact with the fine element 11a. The outermost layer of the model 9 is wholly formed by the fine element 11a. The fine element 11a and the element 11b are subjected to a tied processing.

In the model 9, one element 11b comes in contact with ten fine elements 11a. In the model 9, a ratio (Na/Nb) is 10. Also in the model 9, precision in an analysis is enhanced because of a large number of divisions of the fine element 11a. Also in the model 9, a time required for the analysis can be shortened because of a small number of divisions of the element 11b.

Figure 5:
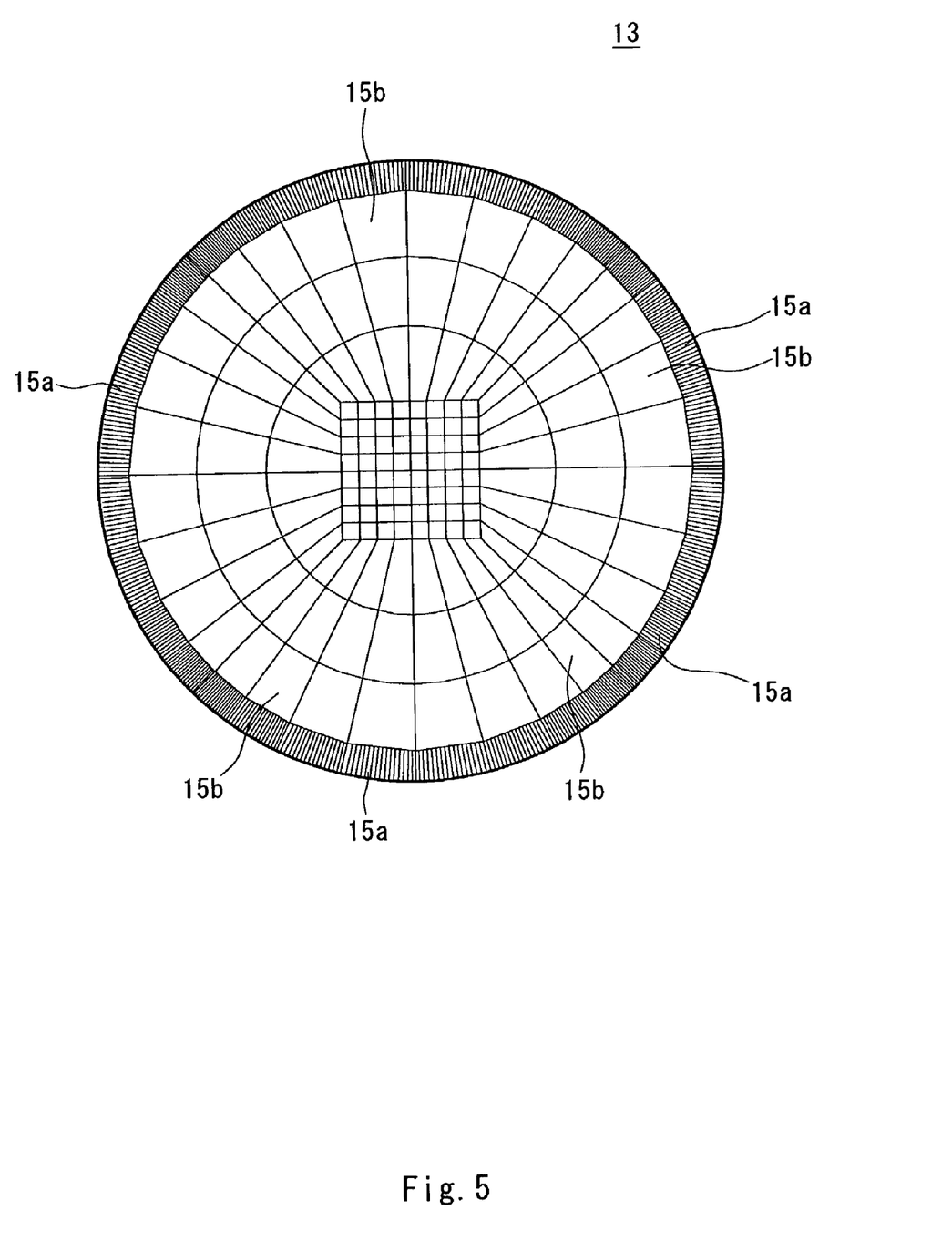
FIG. 5 is a sectional view showing a model to be used in a method of analyzing a physical property of a golf ball according to a further embodiment of the present invention.

FIG. 5 is a sectional view showing a model 13 to be used in a method of analyzing a physical property of a golf ball according to a further embodiment of the present invention. The whole shape of the model 13 is almost spherical. The model 13 is obtained by dividing the golf ball into meshes. In FIG. 5, the reference numeral 15a denotes a fine element. On the other hand, the reference numeral 15b denotes an element which is provided on the inside of the fine element 15a in contact with the fine element 15a. The outermost layer of the model 13 is wholly formed by the fine element 15a. The fine element 15a and the element 15b are subjected to a tied processing.

In the model 13, one element 15b comes in contact with sixteen fine elements 15a. In the model 13, a ratio (Na/Nb) is 16. Also in the model 13, precision in an analysis is enhanced because of a large number of divisions of the fine element 15a. Also in the model 13, a time required for the analysis can be shortened because of a small number of divisions of the element 15b.

EXAMPLES

Example 1

A golf ball model shown in FIGS. 1 and 2 was fabricated. A ratio (Na/Nb) of this model is 5, the total number of elements is 11264 and a length of one side of a fine element has a minimum value of 1 mm. By using this model, an amount of compression and deformation of the golf ball was predicted by a finite element method. For this simulation, a software having a trade name of "ls-dynaVer950" was used. For this simulation, a workstation having a trade name of "Origin" manufactured by SGI Co., Ltd. was used. The workstation comprises four CPUs (300 MHZ, IP27 Processors). The workstation has a main memory size of 2048 MBytes. The detailed structure of the workstation is as follows.

CPU: MIPS R12000 Processor Chip Revision 2.3
FPU: MIPS R12010 Floating Point Chip Revision 0.0

Examples 2 and 3 and Comparative Examples 1 and 2

An amount of compression and deformation of a golf ball was predicted by a finite element method in the same manner as in the example 1 except that a golf ball model shown in the following Table 1 was used.

[Evaluation]

A difference of compression deformation between an amount obtained by a simulation and an amount obtained by measuring an actual golf ball (having a trade name of "DDH TOUR SPECIAL ROYAL BLUE" manufactured by Sumitomo Rubber Industries, Ltd.) was calculated. Moreover, a time required for the simulation and an used memory volume were obtained. These results are shown in the following Table 1.

TABLE 1

Figure 6:
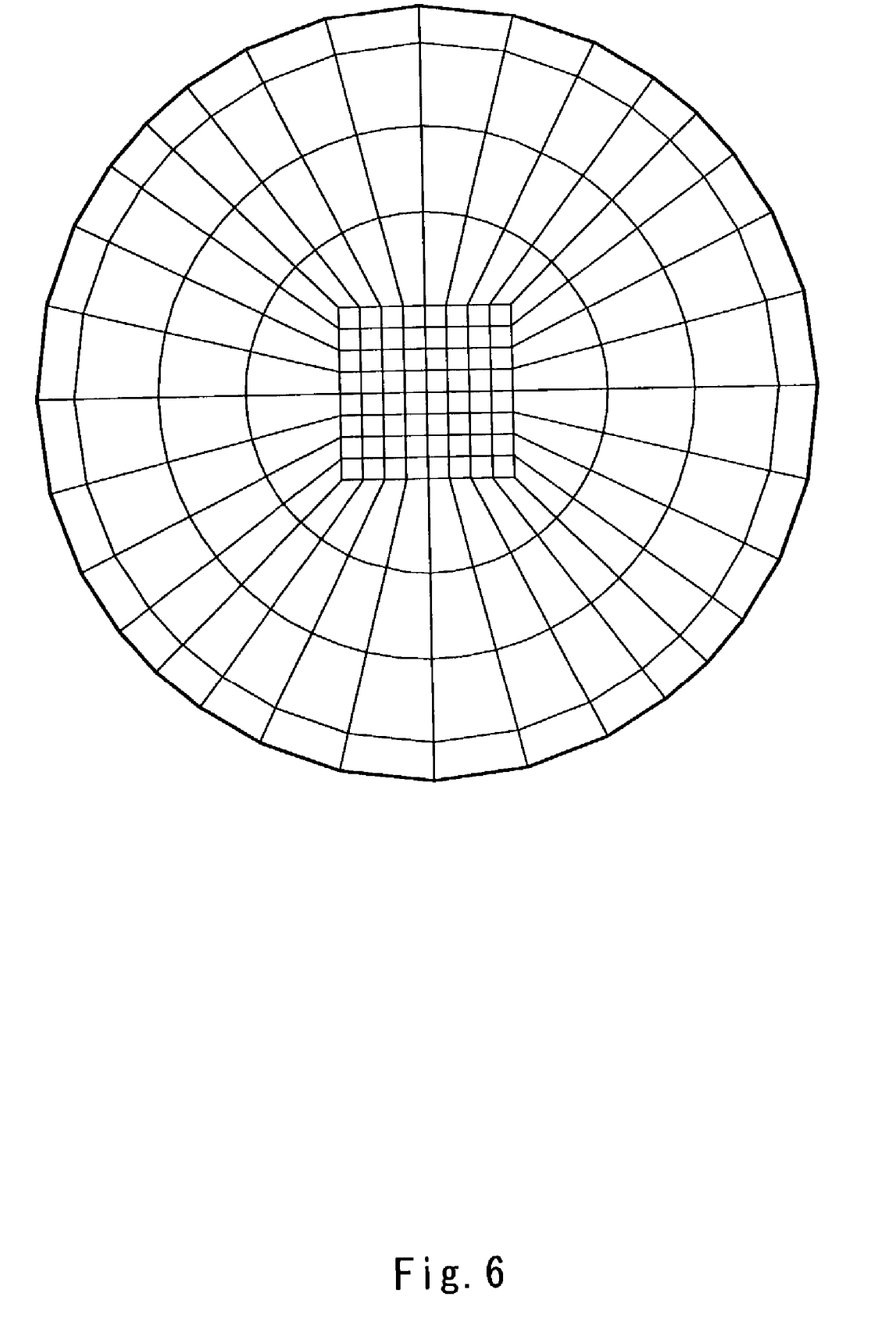
FIG. 6 is a sectional view showing a model to be used in a method of analyzing a physical property of a golf ball according to a comparative example 1 of the present invention.
Figure 7:
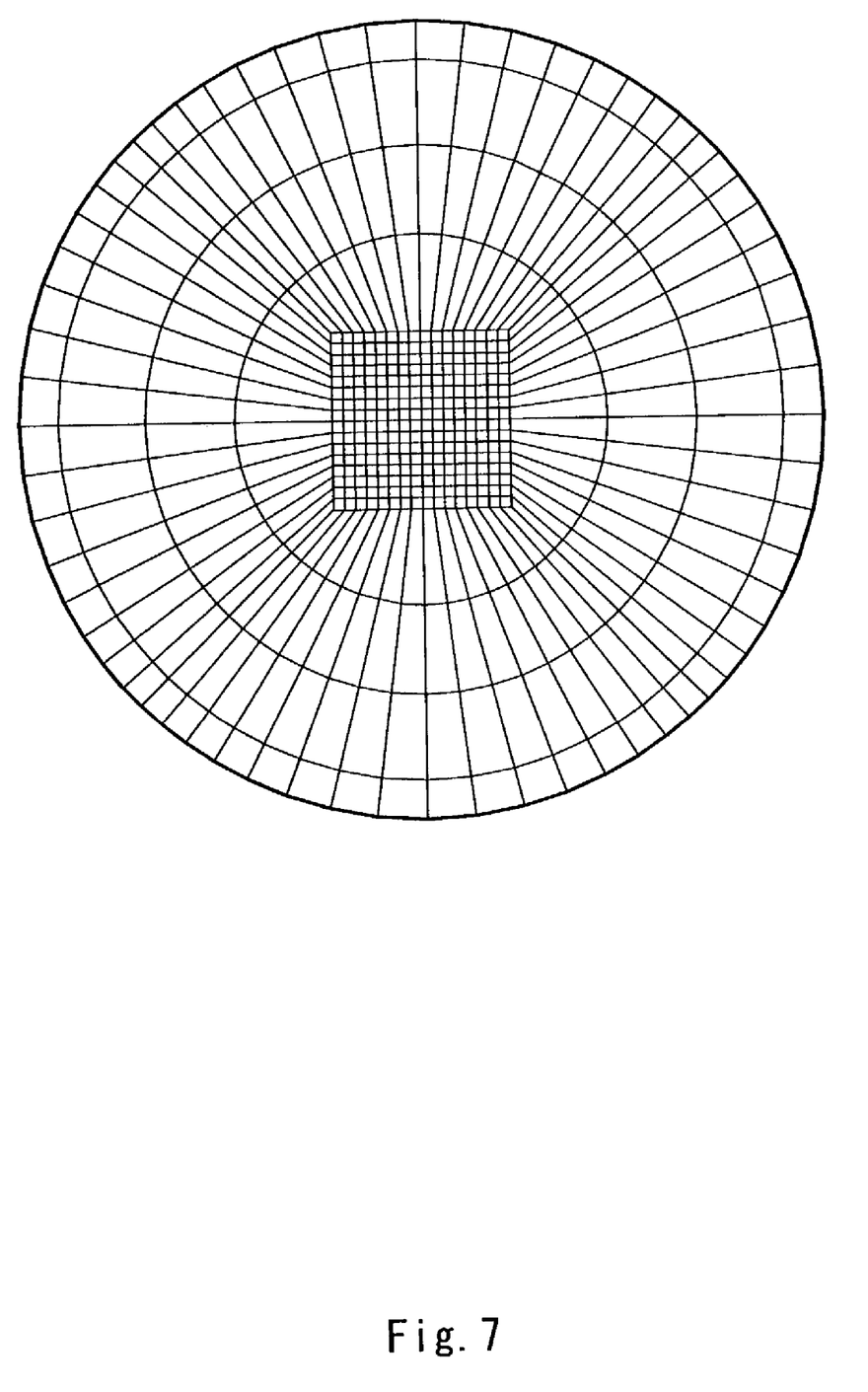
FIG. 7 is a sectional view showing a model to be used in a method of analyzing a physical property of a golf ball according to a comparative example 2 of the present invention.

| | Result of Evaluation | | | | |
|---|---|---|---|---|---|
| | Com. Example 1 | Example 1 | Example 2 | Example 3 | Com. Example 2 |
| Sectional view | FIG. 6 | FIG. 2 | FIG. 4 | FIG. 5 | FIG. 7 |
| (Na/Nb) | 1.0 | 5.0 | 10.0 | 16.0 | 1.0 |
| Total number of elements | 2048 | 11264 | 40064 | 99968 | 10240 |
| Minimum value of length of one side of element (mm) | 1.0 | 1.0 | 0.5 | 0.3 | 0.5 |
| Difference of compression deformation (mm) | 0.50 | 0.11 | 0.10 | 0.08 | 0.30 |
| Time required for calculation (min) | 6 | 10 | 11 | 20 | 10 |
| Used memory volume (MByte) | 50 | 60 | 65 | 100 | 60 |

As shown in the Table 1, a difference of compression deformation is small in the analyzing method according to each of the examples. This indicates that precision in an analysis is excellent. From the results of the evaluation, the advantage of the present invention is apparent.

The above description is only illustrative and various changes can be made without departing from the scope of the invention.

What is claimed is:

1. A method of analyzing a physical property of a golf ball comprising the steps of:
dividing a golf ball into a large number of meshed elements to obtain a model including a plurality of layers formed by a group of the elements; and
analyzing a physical property by a simulation using the model,
wherein the model includes a first layer having a fine element region, the fine element region extending around at least a portion of a circumference of the first layer, and
wherein the total number (Na) of divisions in a circumferential direction of the fine element region around said portion of the circumference of the first layer is set to be larger than the total number (Nb) of divisions in a circumferential direction of a second layer around said portion of the circumference of the first layer, said second layer being inside said first layer.

2. The analyzing method according to claim 1, wherein a ratio (Na/Nb) of the total number of divisions (Na) of the first layer to the number of divisions (Nb) of the second layer is 1.1 to 15.0.

3. The analyzing method according to claim 1, wherein the fine element region is positioned on an outermost layer of the model.

4. The analyzing method according to claim 1, wherein the elements in the fine element region and the elements in the second layer are tied to each other by being subjected to a tied processing.

5. The analyzing method according to claim 1, wherein the first layer that includes the fine element region also includes a region having a smaller total number of divisions than in the fine element region, said region having the smaller total number of divisions extending around a circumference that is the same as said portion of the circumference.

6. The analyzing method according to claim 1, wherein the fine element region of the first layer extends around the entire circumference of the first layer, and the total number (Na) of divisions in the first layer is set to be larger than the total number (Nb) of divisions in the second layer.

7. The analyzing method according to claim 1, wherein the fine element region extends around an entire circumference of the first layer.

8. A method of analyzing a physical property of a golf ball comprising the steps of:
dividing a golf ball into a large number of meshed elements to obtain a model including a plurality of layers formed by a group of the elements; and
analyzing a physical property by a simulation using the model,
wherein the model includes a first layer and a second layer inside said first layer, the total number (Na) of elements in a first region of the first layer that extends over a first number of degrees of circumference of the first layer is larger than the total number (Nb) of elements in a second region of the second layer that extends over said first number of degrees of circumference.

9. The analyzing method according to claim 8, wherein a ratio (Na/Nb) of the total number of elements (Na) of the first layer to the total number of elements (Nb) of the second layer is 1.1 to 15.0.

10. The analyzing method according to claim 8, wherein the first layer is positioned on an outermost layer of the model.

11. The analyzing method according to claim 8, wherein the elements in the first region and the elements in the second region are tied to each other by being subjected to a tied processing.

12. The analyzing method according to claim 8, wherein the first layer includes a third region having a total number of elements that is less than the total number of elements in the first region, the third region extending over a number of degrees of circumference that is equal to said first number of degrees of circumference.

13. The analyzing method according to claim 8, wherein the first region extends around an entire circumference of the first layer.

14. The analyzing method according to claim 8, wherein the first region of the first layer extends around the entire circumference of the first layer, and the total number (Na) of elements in the first layer is set to be larger than the total number (Nb) of elements in the second layer.

* * * * *